United States Patent
Aoki et al.

[11] Patent Number: 5,923,073
[45] Date of Patent: Jul. 13, 1999

[54] METHOD OF MANUFACTURING A SEMICONDUCTOR DEVICE AND SEMICONDUCTOR DEVICE MANUFACTURED ACCORDING TO THE METHOD

[75] Inventors: Masami Aoki; Hiroshi Takato, both of Kanagawa-ken, Japan

[73] Assignee: Kabushiki Kaisha Toshiba, Kawasaki, Japan

[21] Appl. No.: 08/932,388

[22] Filed: Sep. 17, 1997

Related U.S. Application Data

[63] Continuation of application No. 08/669,839, Jun. 26, 1996., abandoned, which is a continuation of application No. 08/512,036, Aug. 7, 1995., abandoned, which is a continuation of application No. 08/332,803, Nov. 2, 1994., abandoned, which is a division of application No. 07/906,654, Jun. 30, 1992., Pat. No. 5,384,280

[30] Foreign Application Priority Data

Jul. 1, 1991 [JP] Japan ................................. P03-160629

[51] Int. Cl.⁶ .................................................. H01L 29/72
[52] U.S. Cl. .......................... 257/501; 257/513; 257/520
[58] Field of Search ..................... 257/501, 513, 257/520

[56] References Cited

U.S. PATENT DOCUMENTS

| | | | |
|---|---|---|---|
| 4,688,069 | 8/1987 | Joy et al. | 257/520 |
| 4,980,747 | 12/1990 | Hutter et al. | 257/520 |
| 5,061,653 | 10/1991 | Teng | 257/520 |

*Primary Examiner*—Edward Wojciechowicz
*Attorney, Agent, or Firm*—Finnegan, Henderson, Farabow, Garrett & Dunner, L.L.P.

[57] ABSTRACT

A manufacturing method of semiconductor devices and semiconductor devices isolated by a trench portion. The trench portion is refilled with a Si epitaxial growth layer. The trench has a first insulating layer on its side wall and a second insulating layer formed by the oxidation in the self-alignment manner, as a cap layer, on the top portion of the trench. A semiconductor device formed on the substrate is isolated by the trench. The excessive leakage currents created by the stress between the substrate and the Si epitaxial layer are decreased. The concentration of the field effect at the corner portion of the trench is suppressed by the cap layer.

The refilling step can be also made to a trench having the wider opening and another trench having the narrower opening simultaneously and uniformly.

19 Claims, 4 Drawing Sheets

METHOD OF MANUFACTURING A SEMICONDUCTOR DEVICE AND SEMICONDUCTOR DEVICE MANUFACTURED ACCORDING TO THE METHOD

This application is a continuation of application Ser. No. 08/669,839, filed Jun. 26, 1996, now abandoned, which is a continuation of Ser. No. 08/512,036, filed Aug. 7, 1995, now abandoned, which is a continuation of Ser. No. 08/332,803, filed Nov. 2, 1994, now abandoned, which is a division of Ser. No. 07/906,654, filed Jun. 30, 1992, now U.S. Pat. No. 5,384,280 (issued Jan. 24, 1995).

BACKGROUND OF THE INVENTION

1. Field of the Invention

This invention relates to a manufacturing method for an isolated semiconductor device by using selective epitaxial growth of semiconductive material.

2. Description of The Related Art

Recently semiconductor integrated circuits such as DRAMs have been developed to satisfy high density by micro-fablication technologies. Accordingly, to prevent a parasitic channel and to minimize a parasitic capacity, it is required to form a thick field isolation layer between a semiconductor device and other semiconductor devices in the integrated circuit and isolate the devices from each other.

As an example of the isolating method, a local oxidation method (LOCOS method) is widely used. However this method is not adequate to make a field isolation in submicron dimensions. Because the field isolation portion is formed by oxidation and the oxidized isolation portion causes birdsbeak which goes into a device region. So this method needs to allow a margin for the birdsbeak.

There is an another example of the isolating method that forms grooves on the field area of the Si substrate, refills a $SiO_2$ layer into the groove, and then planarizes the surface of the $SiO_2$ layer. This method is called a BOX method.

This method can isolate devices effectively, but it has a problem, which is formation of crystal defects in the substrate caused by a thermal stress to the substrate. The stress is caused by a difference in thermal expansion coefficients between the $SiO_2$ layer and the Si substrate. The stress tends to cause excessive leakage currents during the device operation.

To resolve the problems, a method to suppress the excessive leakage currents by using a low stress material such poly Si as refill material, instead of an $SiO_2$ layer, has been proposed.

This method is to refill the poly Si by the CVD method, after a thin $SiO_2$ layer has been formed on a whole inner surface of the groove.

According to this method, the stress caused by the difference in thermal expansion coefficients is decreased because most of the material in the groove is poly Si.

However the device formed by the method has to undergo some oxidation steps, for example to make devices, after the refill of the poly Si layer, so there :an be also crystal defects after the steps. This is because a wedge shaped oxidation layer is formed in the upper corner of the groove by the oxidation steps and the wedge shaped oxidation layer causes the crystal defects in the substrate.

If the surface of the $SiO_2$ layer is below a surface of the substrate and a corner portion of the groove is exposed, this causes a concentration of the electric field at the corner portion of the groove, which decreases the threshold voltage of devices such as MOSFETs formed afterwards and which also makes the threshold characteristic have a hump.

In addition, when the poly Si is oxidized to cover the surface of the poly Si after refill of the trench and the surface of the poly Si is located under the surface of the Si substrate, the oxidation causes an expansion and it leads to a destruction of the grooves because of stress between the oxidized poly Si and the substrate.

In regard to the isolation process using the CVD method, it is difficult to refill a narrower groove and a wider groove simultaneousely and uniformly to the same level in depth.

For example, as shown in FIG. 1(a), the poly Si 100 is deposited on the narrower groove 101 and the wider groove 102 of the substrate 103. 104 is a thermal oxide layer. After the poly Si 100 is etched back so as to expose the surface of the substrate 103, the narrower groove 101 is refilled completely, but the wider groove 102 is not completely filled (FIG. 1 (b)).

FIG. 2 shows another isolating method that refills a thin slit of groove 200 on a substrate 204 with an insulating material 201 (FIG. 2(a)).

In this method, in order to protect the groove, a cap layer 202 made of $SiO_2$ is formed over the groove. To form the cap layer, a resist pattern 203 is patterned by using a mask alignment technique and is used as a mask to etch $SiO_2$ 202 (FIG. 2(b)). So it needs to predetermine a margin of the alignment error when the cap layer formed.

As explained above, the selective dioxidation method (LOCOS method) has a problem that the birdsbeak goes into the device region and limits the integration.

The BOX method also has a problem that the oxidation between the substrate and the $SiO_2$ or the poly Si causes the wedge shaped damages and crystal defects to the substrate from the groove. These damages and defects lead to increase excessive leakage currents.

And it is hard to refill the grooves with the insulating materials simultaneously and uniformly to the same level in depth independent from the width of the groove.

SUMMARY OF THE INVENTION

Accordingly, it is an object of the present invention to be able to integrate devices being isolated by the isolating portion in the submicron dimension.

It is another object of the present invention to decrease the excessive leakage currents caused by the stress between the isolating materials and the substrate.

It is still another object of the present invention to reduce the concentration of the electric field at the corner portion of the field isolation.

It is another object of the present invention to make it easy to refill the grooves having various opening widths substantially simultaneously and uniformly in the same depth.

It is another object of the present invention not to need alignment when a cap layer to cover the groove is formed.

To accomplish the above described objects, there is provided:

A manufacturing method for semiconductor devices, comprising the steps of:
(a) etching a semiconductor substrate to form a trench having a side wall, an upper corner portion and a bottom surface on the substrate;
(b) forming an insulating layer on the side wall of the trench;

(c) refilling the trench with a semicondctor epitaxial growth layer;

(d) overfilling the upper corner portion of the trench with the epitaxial layer; and (e) oxidizing the overfilled epitaxial growth layer, whereby an isolating portion to isolate semiconductor devices on the substrate is formed.

The invention also provides a semiconductor device comprising:

(a) a semiconductor substrate having a trench on a surface, in which the trench has a side wall, an upper corner portion and a bottom surface;

(b) a first insulating layer formed on the side wall of the trench;

(c) a semiconductor layer formed from the bottom surface of the trench by an epitaxial growth so as to refill the trench;

(d) a second insulating layer covering the upper corner portion of the trench; and (e) semiconductor elements formed on the substrate and isolated by the trench.

DESCRIPTION OF THE PREFERRED EMBODIMENTS

FIG. 3(a)–(d) shows a sectional process view of the first embodiment of the present invention.

Figure 1A:
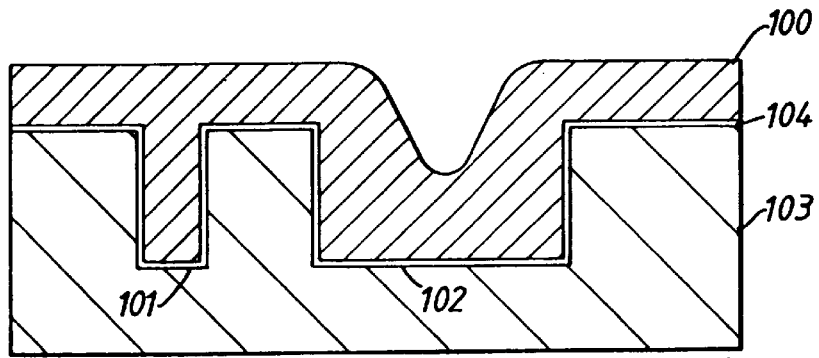
FIG. 1(a–b) is a schematic sectional view to explain a isolating method of a related art.
Figure 1B:
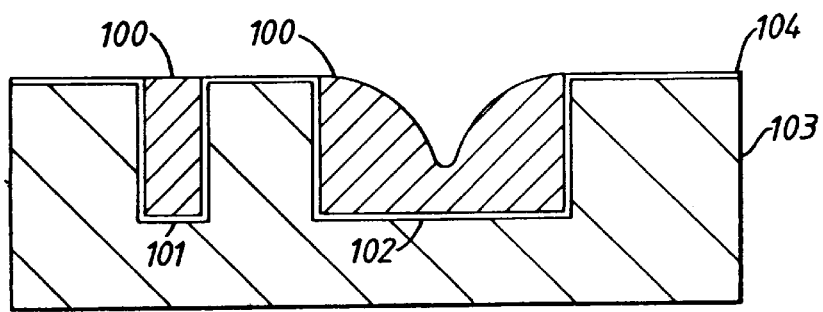
Figure 2A:
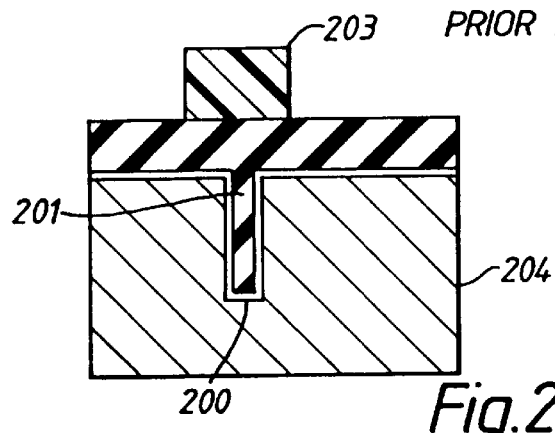
FIG. 2(a–b) is a schematic sectional view to explain another isolating method of the related art.
Figure 2B:
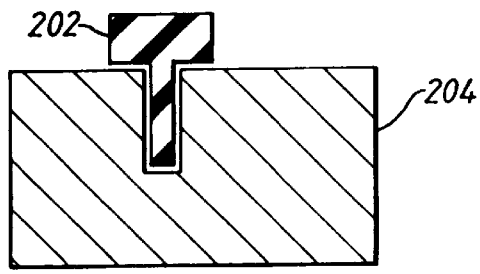
Figure 3A:
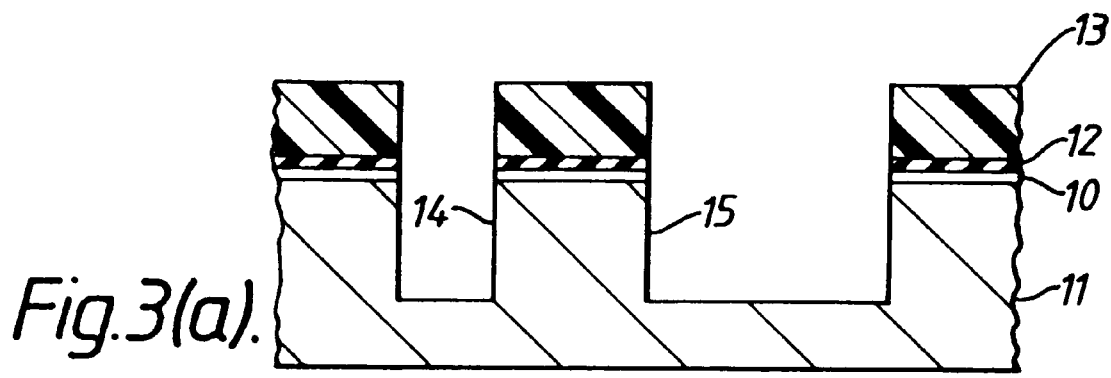
FIG. 3(a–d) illustrates a sectional process view of the first preferred embodiment of the present invention.

As shown in FIG. 3(a), a thermal oxide layer 10 about 50 nm thick is formed on a p type (100) Si substrate 11.

The resistivity of the substrate is 5–50 Ωcm. A 50 nm thick silicon nitride layer 12 is deposited on the surface of oxide layer 10 by a known CVD method. A desired resist pattern 13 is patterned on the nitride layer 12 by a known lithography process. Then 0.5 µm deep trenches 14, 15 are formed by reactive ion etching(RIE) by using resist pattern 13 as a mask. Trench 14 has a 0.2 µm wide opening and trench 15 has 1.0 µm wide opening.

Figure 3B:
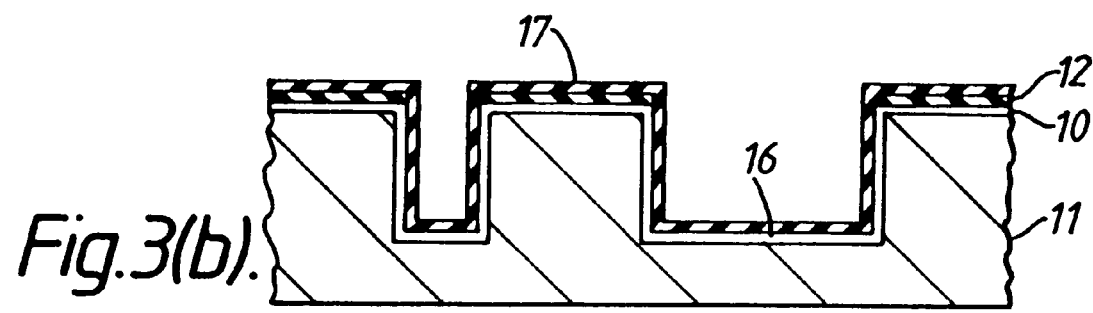

After that, a 20 nm layer of thermal oxide layer 16 is formed on the surface of the substrate and a 20 nm layer of nitride layer 17 is further deposited on the upper layer (FIG. 3(b)).

Silicon nitride layer 17 and thermal oxide layer 16 at the bottom of the trenches are removed selectively by an anisotropic etching such as RIE and the bottom surface of the trenches is exposed. In this process silicon nitride layer 17 and oxide layer 16 of the sidewall are left intact.

A Si layer 18 is continuously grown from the bottom surface of the trenches by a selective epitaxial growth method and the trenches are refilled by Si layer 18. Si grown layer 18 is overfilled to 50–200 nm above from the surface of the Si substrate so as to make a convex configuration which just covers the upper corner portion of the trenches (FIG. 3(c)).

Figure 3C:
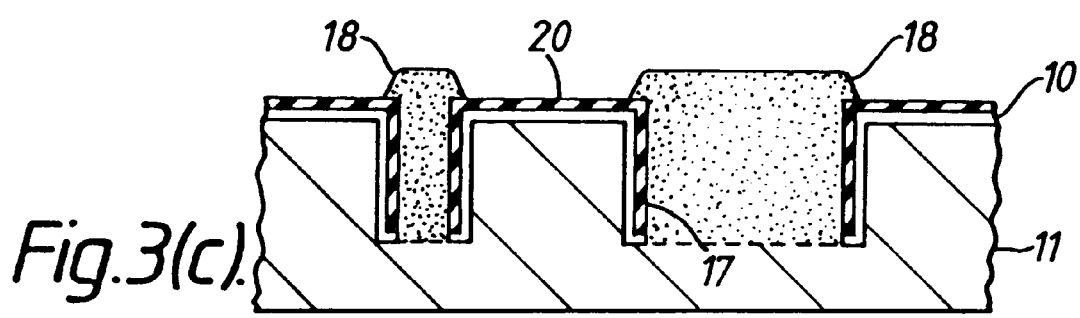

The temperature of the selective epitaxial growth method is set up about 850–900° C. The temperature is important to form the configuration of the convex portion, as shown in FIG. 3(c). If the temperature is over 900° C., the configuration may have a sharp facet. Also if it is below 850° C., the growth rate may be insufficient for practical use.

And a compound gas, $SiH_2Cl_2/HCl/H_2$, is used during the epitaxial growth.

A removing step to remove a natural oxide on the substrate could be added before the selective epitaxial process.

The convex portion is oxidized and the surface of the convex portion becomes a $SiO_2$ layer 19 and covers the upper corner of the trench as a cap layer that is self-aligned with the trench because its shape, location, and edge definition are established by the Si layer filling the trench.

Figure 3D:
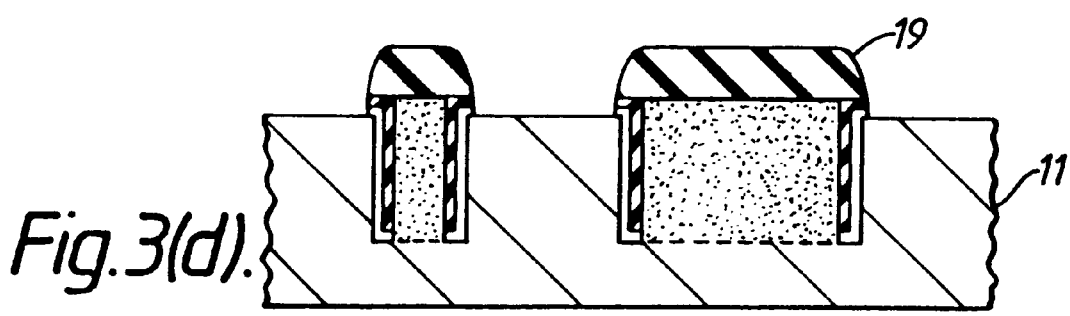

After that insulating layer 20 and $SiO_2$ layer 10 on the surface of the substrate are removed by RIE, with the cap layer 19 acting as a mask, and the isolation portion is completed (FIG. 3(d)).

The most important thing is that the width of the isolation portion is almost determined by the 0.2 µm or 1.0 µm width of the trenches, as the top layer is self-aligned when it is oxidized. And finally desired devices such as DRAMs (not illustrated in the figure) are formed by known processes on the surface of the substrate, with each being isolated from the others by the isolation portion.

According to this embodiment, the stress during the annealing processes of forming devices could be suppressed minimally. This is because most of the material which refills the trench is epitaxial grown Si and the thermal expansion coefficient of the Si is almost the same as the Si substrate.

Moreover even if there is some stress, the stress is released from the isolation portion to the substrate through the bottom portion of the trench.

Also as the upper corner portion is covered by the epitaxial grown Si during the annealing processes, wedge shaped oxidation in the corner portion can not be formed.

As a result in this embodiment it is possible to decrease the wedge shaped damages and the crystal defects to the Si substrate It is also possible to decrease i:he concentration of the field effect because of the cap layer which covers the corner portion of the trench.

The growth rate of Si layer 18 can be constant in the both of trenches 14, 15, so that it is possible to refill the trenches that have different opening widths simultaneously and uniformly to the same level in depth.

Moreover it is possible to decrease losses of the isolation portion based on the alignment error of the mask and is also possible to form a submicron sized reliable isolation portion.

Figure 4:
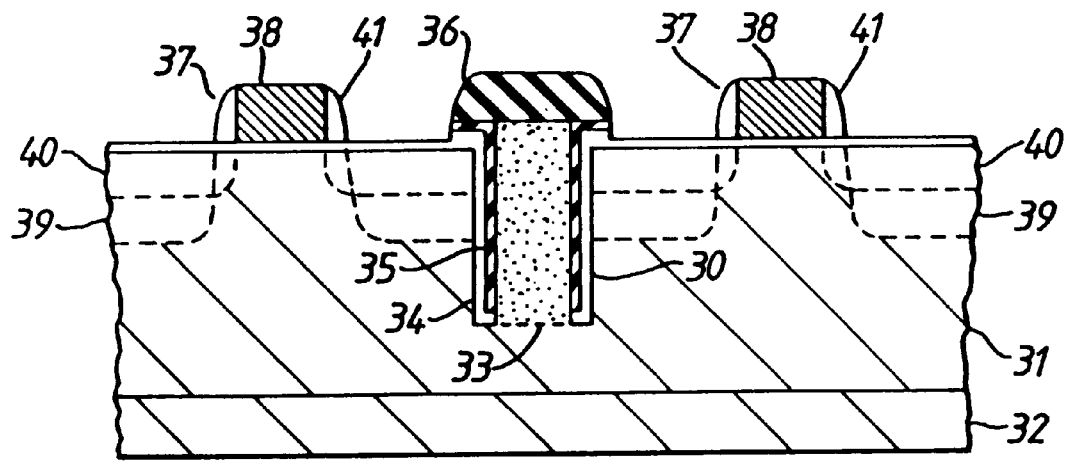
FIG. 4 is a sectional view of the second embodiment of the present invention.

FIG.4 shows a schematic view of the second embodiment related to the present invention. FIG.4 is an example of MOSFETs isolated by the isolated portion which is formed by the same manner as the embodiment 1.

A trench 30 is formed on a p well. 31 of the substrate 32. The trench 30 is refilled with a p+Si epitaxial layer 33. The sidewall of the trench 30 is covered by a $SiO_2$ layer 34 and a silicon nitride layer 35. The top surface of the trench is covered by $SiO_2$ layer 36. This layer 36 has a very small portion which overhangs the trench region 30. The corner portion of the trench is surrounded by the layers 34, 35 and 36 to prevent the concentration of the electric field. An isolation portion is determined by $SiO_2$ layer 36 and the trench portion.

The method to make the isolation portion is almost the same as the first embodiment except that p$^+$ Si layer 33 is formed by adding a doping gas, such as $B_2H_6$. The resistivity of the layer 33 is easily controlled to be a few to a few hundred Ωcm by changing the compound ratio of the gas. In this embodiment the impurity of the layer 33 is $8–10^{16} cm^{-3}$ as same as the p well 31.

After that, two MOSFETs 37 with a LDD structure are formed at the both sides of the isolation portion. The MOSFETs have a gate electrodes 38, n type diffusion layers 39, 40, and $SiO_2$ sidewalls 41.

The same potential, such as 1 V, is given to the layer 33 and the p well 31 to suppress leak currents based on an inversion of the layer 33 caused by a capacity coupling with upper wires.

Accordingly an additional advantage of the second embodiment, compared with embodiment 1, does not need to have an ion implantation step to prevent inversion, so it is possible to reduce deterioration of the characteristic of the transistors.

Figure 5A:
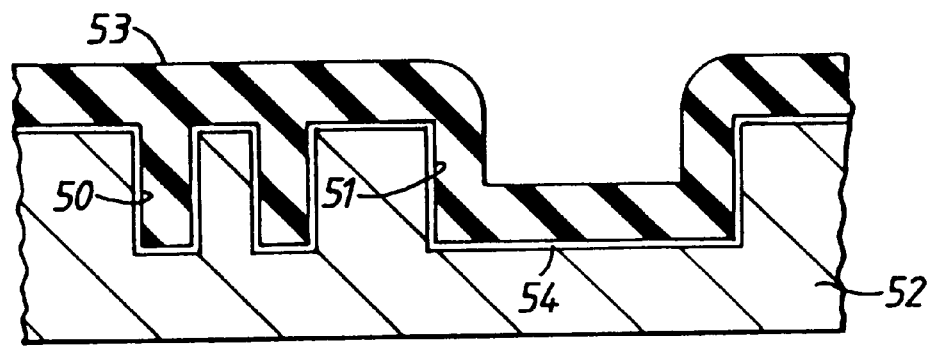
FIG. 5(a–b) shows a sectional view of the third embodiment of the present invention.

In the first embodiment the Si layer 18 refills both trenches 14, 15 , but in this third embodiment a trench with a narrower opening is refilled with only an insulative layer and a trench with a wider opening is refilled with a Si epitaxial layer after a sidewall's incubative layer is formed. These steps are shown in FIG. 5(a),(b).

Trenches 50, 51 with different sizes of opening are formed on the substrate 52. The width of the openings are 0.1 $\mu$m and 0.7 $\mu$m respectively. After an oxidation of the substrate 52, a silicon nitride layer 53 is deposited on the substrate 52 by the CVD method. Layer 54 is a thermal $SiO_2$ layer (FIG. 5(a)).

A different point from the embodiment 1 is that trench 50 with the smaller opening is completely refilled by the silicon nitride layer 53. The thickness of the layer 53 is about 50–100 nm.

After that an anisotropic etching such as RIE is done to etch layer 53 on the substrate 52. The layer 53 in trench 50 and at the side wall of the trench 51 are left and the bottom portion of the trench 51 is exposed by the RIE.

Figure 5B:
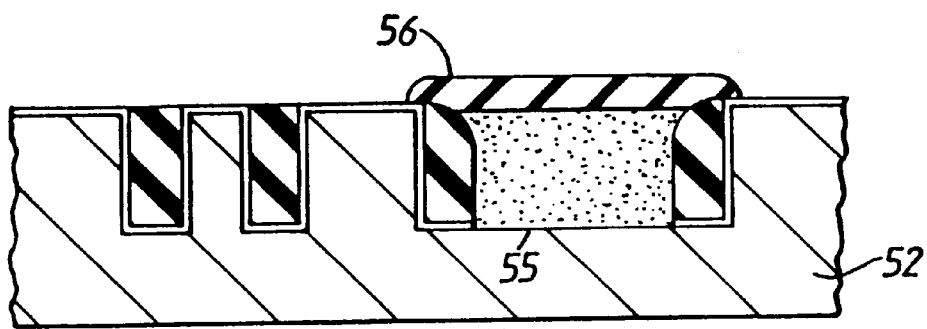

After these processes a similar step to the first embodiment is processed (FIG. 5(b)). Layer 55 is a silicon epitaxial layer and 56 is a cap layer, This embodiment teaches another way to refill trenches with different sizes of opening by forming a silicon nitride layer more thick than the layer of the first embodiment. But even in this embodiment it is possible to make the isolating portion as shown in the first embodiment if the silicon nitride layer 53 is formed to be thin.

The fourth embodiment is another example of the invention of a device isolated by the isolation portion.

Figure 6A:
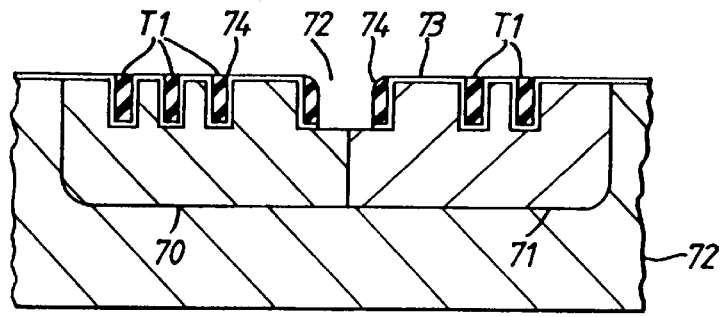
FIG. 6(a–b) shows a sectional view of the fourth embodiment of the present invention.

As shown in FIG. 6(a) p well 70 and n well 71 are formed adjacently on the Si substrate 72. A plurality of trenches T1 with a smaller openings are existent on each of the wells. A trench with a larger opening is formed over p well 70 and n well 71. A thermal oxide layer 73 is formed in trench T1, T2 and the surface of the substrate 72. The thickness of the layer is about 20 nm.

A way to deposit a SiN layer 74 into the trenches is the same as in the second embodiment. After the SiN layer 74 is deposited, RIE is processed to the trench T2 with by the thermal oxide layer 73 and the SiN layer 74 being used as a mask. A third trench T3 is formed under the second trench T2, whose depth reaches below the wells.

After a thin SiN layer 75 is formed on the side wall of the trenches T2, T3, a Si epitaxial layer 76 is grown from the bottom surface of the trench T3 to refill the trenches T2, T3 the same as in the first embodiment.

Figure 6B:
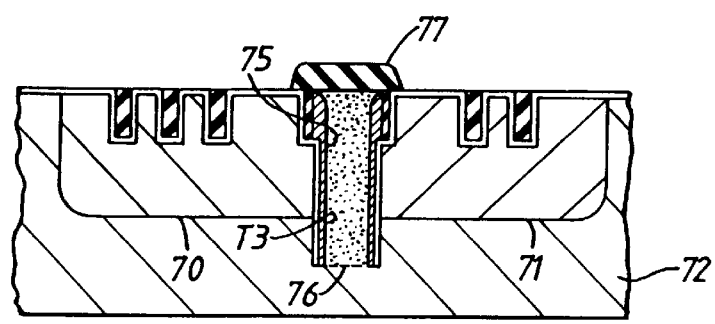

And a $SiO_2$ layer 77 is capped over the trench T2 to cover the corner portion of the trench T2. The thickness of the $SiO_2$ layer 77 is about 100–200 nm (FIG. 6(b)).

Accordingly, this embodiment is capable of isolating the p well and the n well effectively. Also the $SiO_2$ cap layer 77 is self-aligned with the third trench T3, so the process to form the trench is simplified.

The fifth embodiment is concerned with another example of making a cap layer after forming a Si epitaxial layer. The cap layer is formed like a LOCOS configuration.

Figure 7A:
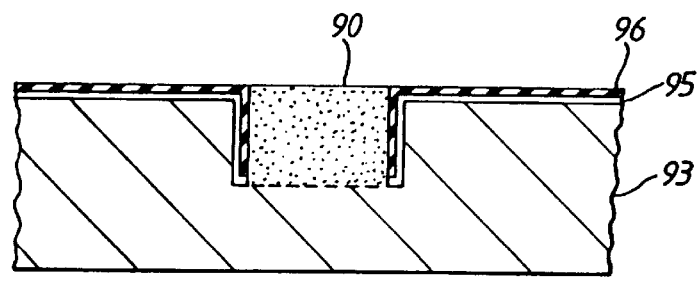
FIG. 7(a–b) shows a sectional view of the fifth embodiment of the present invention.

The process up to forming of the Si epitaxial layer 90 is the same as the first embodiment, as shown in FIG. 7(a).

Figure 7B:
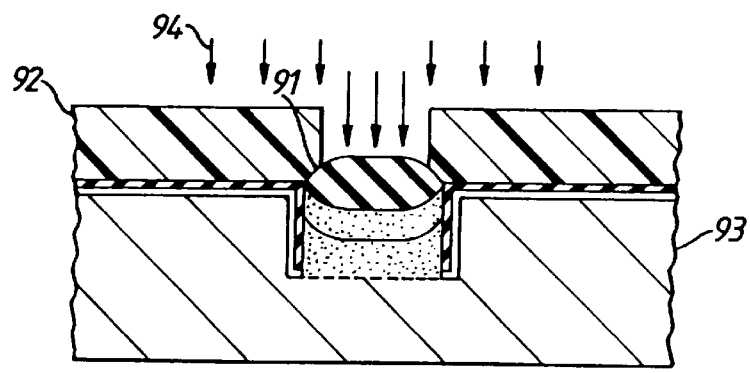

And a cap layer 91 made of $SiO_2$ is formed by a 6 hours thermal treatment in 1000° C. water vapor. $SiO_2$ 91 is formed like the configuration made by the LOCOS method (FIG. 7(b)).

After that a resist pattern 92 is formed on a Si substrate 93 besides on the $SiO_2$ layer 91. To prevent inversion layers from forming an ion implantation is made under the $SiO_2$ layer 91. Boron 94 is used in the ion implantation and the condition is 50 KeV of an accelerating voltage and $1 \times 10^{13}$ $cm^{-2}$ of dose. 95 is a thermal dioxide layer and 96 is SiN layer.

According to this embodiment, it is important that a birdsbeak is suppressed to expand outward from the trench by dioxide layer 95 and SiN layer 96. These layers 95, 96 also have a function to suppress the Boron ion's diffusion, so it is possible to decrease the deterioration of the devices formed afterward.

And it may be possible to reduce the implantation step if the Si epitaxial layer 90 is formed of a p type Si epitaxial layer as in the second embodiment.

Numerous modifications and variations of the present invention are possible in light of the above teachings. It is therefore to be understood that, within the scope of the appended claims, the present invention can be practiced in a manner other than as specifically described herein.

what is claimed is:

1. A semiconductor device comprising:
   (a) a semiconductor substrate having a trench on a surface, the trench having a side wall, an upper corner portion, and a bottom surface;
   (b) a first insulating layer on the side wall of the trench;
   (c) a semiconductor layer refilling the trench from the bottom surface of the trench to the upper corner portion of the trench;
   (d) a second insulating layer, self-aligned with and covering an exposed surface of the semiconductor layer and the upper corner portion of the trench; and
   (e) semiconductor elements on the substrate, the semiconductor elements being isolated by the trench.

2. A semiconductor device according to claim 1, wherein the semiconductor elements include at least two MOSFETs, each having a source and drain region, said MOSFETs being isolated from each other by the trench.

3. A semiconductor device according to claim 1, wherein the substrate has p well and an adjacent n well and the trench extends through the wells.

4. A semiconductor device according to claim 1, wherein the semiconductor layer is an epitaxial growth layer.

5. A semiconductor device comprising:
   (a) a semiconductor substrate having on a surface, a first trench and a second trench spaced from the first trench and having a narrower opening than the first trench, each trench having a side wall, an upper corner portion, and a bottom surface respectively;
   (b) a first insulating layer on the side wall of each trench;
   (c) a semiconductor layer refilled in each trench;
   (d) a second insulating layer, self-aligned with and covering an exposed surface of the semiconductor layer and the upper corner portion of each trench; and
   (e) semiconductor elements formed on the substrate and isolated by the first and second trench.

6. A semiconductor device according to claim 5, wherein the semiconductor elements include at least two MOSFETS, each having a source and drain region, said MOSFETs being isolated from each other by one of the trenches.

7. A semiconductor device according to claim 5, wherein the substrate has a p well and an adjacent n well, and one of the trenches extends through the wells.

8. A semiconductor device according to claim 5, wherein the semiconductor layer is an epitaxial growth layer.

9. A semiconductor device comprising:
   (a) a semiconductor substrate having on a surface, a first trench and a second trench having a narrower opening than the first trench, the first trench and the second trench having a side wall, an upper corner portion, and a bottom surface respectively;
   (b) a first insulating layer on the side wall of the first trench;
   (c) a second insulating layer completely refilled in the second trench;
   (d) a semiconductor layer refilled, in the first trench;
   (e) a third insulating layer, self-aligned with and covering an exposed surface of the semiconductor layer and the upper corner portion of the first trench; and
   (f) semiconductor elements formed on the substrate and isolated by the first and second trenches.

10. A semiconductor device according to claim 9, wherein the semiconductor elements include at least two MOSFETS, each having a source and drain region, said MOSFETs being isolated from each other by one of the trenches.

11. A semiconductor device according to claim 9, wherein the first insulating layer is the same layer as the second insulating layer.

12. A semiconductor device according to claim 10, wherein the semiconductor layer is an epitaxial growth layer.

13. A semiconductor device comprising:
    (a) a semiconductor substrate having a trench on a surface, the trench having a side wall, an upper corner portion, and a bottom surface;
    (b) a first insulating layer provided on a side wall of the trench;
    (c) a semiconductor layer refilled in the trench;
    (d) a local oxidation layer provided on an upper surface of the semiconductor layer in the trench and self-aligned therewith to cover an exposed surface of the semiconductor layer and the upper corner portion of the trench; and
    (e) semiconductor elements formed on the substrate and isolated by the trench.

14. A semiconductor device according to claim 13, wherein the semiconductor elements include at least two MOSFETS, each having a source and drain region, said MOSFETs being isolated from each other by the trench.

15. A semiconductor device according to claim 13, further comprising an ion implanted layer under the local oxidation layer, diffusion of ions from said implanted layer being suppressed by the first insulating layer.

16. A semiconductor device comprising:
    (a) a semiconductor substrate having a generally flat top surface, a trench in the top surface, the trench having a bottom surface and opposite side surfaces extending from the bottom surface to the top surface, the side surfaces and the top surface defining upper corner portions;
    (b) a first insulating layer on the side surfaces of the trench;
    (c) a semiconductor layer refilling the trench from the bottom surface of the trench to the upper corner portions of the trench;
    (d) a second insulating layer self-aligned with the semiconductor layer and covering the upper corner portions of the trench; and
    (e) semiconductor elements on the substrate, the semiconductor elements being isolated by the trench.

17. A semiconductor device according to any one of claims 1, 5, 9, 13, and 16, wherein the first insulating layer is a silicon nitride layer and the second insulating layer is a silicon oxide layer.

18. A semiconductor device according to claim 9, wherein the third insulating layer is a silicon oxide layer.

19. A semiconductor device according to any one of claims 1, 5, 9, 13, and 16, wherein the first insulating layer covers the side wall of the trench and the upper corner of the trench with substantially the same thickness.

* * * * *